United States Patent
Kanchana et al.

(10) Patent No.: US 9,317,102 B2
(45) Date of Patent: Apr. 19, 2016

(54) POWER CONTROL FOR CACHE STRUCTURES

(71) Applicant: Apple Inc., Cupertino, CA (US)

(72) Inventors: Muditha Kanchana, San Jose, CA (US); Gurjeet S. Saund, Saratoga, CA (US); Harshavardhan Kaushikkar, San Jose, CA (US); Erik P. Machnicki, San Jose, CA (US); Seye Ewedemi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 564 days.

(21) Appl. No.: 13/733,775

(22) Filed: Jan. 3, 2013

(65) Prior Publication Data
US 2014/0189411 A1    Jul. 3, 2014

(51) Int. Cl.
*G06F 1/32* (2006.01)
*G11C 5/14* (2006.01)

(52) U.S. Cl.
CPC .......... *G06F 1/3275* (2013.01); *G06F 1/3225* (2013.01); *G11C 5/144* (2013.01); *Y02B 60/1228* (2013.01)

(58) Field of Classification Search
CPC ..... G06F 1/3225; G06F 1/3275; G11C 5/144; Y02B 60/1228
See application file for complete search history.

(56) References Cited

U.S. PATENT DOCUMENTS

| | | | |
|---|---|---|---|
| 6,640,287 B2 | 10/2003 | Gharachorloo et al. | |
| 6,785,775 B1 | 8/2004 | Malek | |
| 7,472,302 B2 | 12/2008 | Hu et al. | |
| 7,689,772 B2 | 3/2010 | Damaraju et al. | |
| 8,171,220 B2 | 5/2012 | Balakrishnan et al. | |
| 8,171,326 B2* | 5/2012 | Keller et al. | 713/324 |
| 2008/0077813 A1* | 3/2008 | Keller et al. | 713/320 |
| 2009/0083493 A1* | 3/2009 | Kinter | 711/141 |
| 2010/0235670 A1* | 9/2010 | Keller et al. | 713/324 |
| 2013/0031314 A1* | 1/2013 | Kinter | 711/141 |
| 2014/0089590 A1* | 3/2014 | Biswas et al. | 711/128 |

* cited by examiner

*Primary Examiner* — M Elamin
*Assistant Examiner* — Abdelmoniem Elamin
(74) *Attorney, Agent, or Firm* — Meyertons, Hood, Kivlin, Kowert & Goetzel, P.C.

(57) ABSTRACT

Techniques are disclosed relating to reducing power consumption in integrated circuits. In one embodiment, an apparatus includes a cache having a set of tag structures and a power management unit. The power management unit is configured to power down a duplicate set of tag structures in responsive to the cache being powered down. In one embodiment, the cache is configured to provide, to the power management unit, an indication of whether the cache includes valid data. In such an embodiment, the power management unit is configured to power down the cache in response to the cache indicating that the cache does not include valid data. In some embodiments, the duplicate set of tag structures is located within a coherence point configured to maintain coherency between the cache and a memory.

20 Claims, 5 Drawing Sheets

POWER CONTROL FOR CACHE STRUCTURES

BACKGROUND

1. Technical Field

This disclosure relates generally to integrated circuits, and, more specifically, to reducing power consumption in integrated circuits.

2. Description of the Related Art

Power management is a common concern in integrated circuit design and can be particularly important in mobile devices such as personal digital assistants (PDAs), cell phones, smart phones, laptop computers, net top computers, etc. These mobile devices often rely on battery power, and reducing power consumption in the integrated circuits can increase the life of the battery power. Additionally, reducing power consumption can reduce the heat generated by the integrated circuit, which can reduce cooling requirements in the device that includes the integrated circuit (whether or not it is relying on battery power).

In some instance, an integrated circuit may attempt to reduce power consumption by supporting operation of different power modes. These modes may be associated with different respective clock frequencies and/or include disabling portions of the integrated circuit that correspond to various functionality when it is not currently in use.

SUMMARY

The present disclosure describes embodiments in which a computer system may reduce power to one or more structures used to implement a cache coherency scheme. Accordingly, in one embodiment, a computer system may implement a cache coherency scheme using a circuit referred to below as a coherence point. In various embodiments, this circuit may include a duplicate set of tag structures for one or more caches in the computer system to facilitate maintaining coherency. (In another embodiment, the duplicate set of tag structures may be located elsewhere; in other embodiments, the computer system may not include a coherence point and/or a duplicate set of tag structures.)

In various embodiments, the computer system may power down one or more caches when they are no longer in use—e.g., they do not include valid data. In some embodiments, in response to powering down the caches, the computer system may further power down one or more portions of the coherence point such as the duplicate set of tag structures.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

As used herein, the terms "first," "second," etc., are used as labels for nouns that they precede, and do not imply any type of ordering (e.g., spatial, temporal, logical, etc.). For example, in a processor having eight processing cores, the terms "first" and "second" processing cores can be used to refer to any two of the eight processing cores. In other words, the "first" and "second" processing cores are not limited to logical processing cores 0 and 1.

As used herein, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Figure 1:
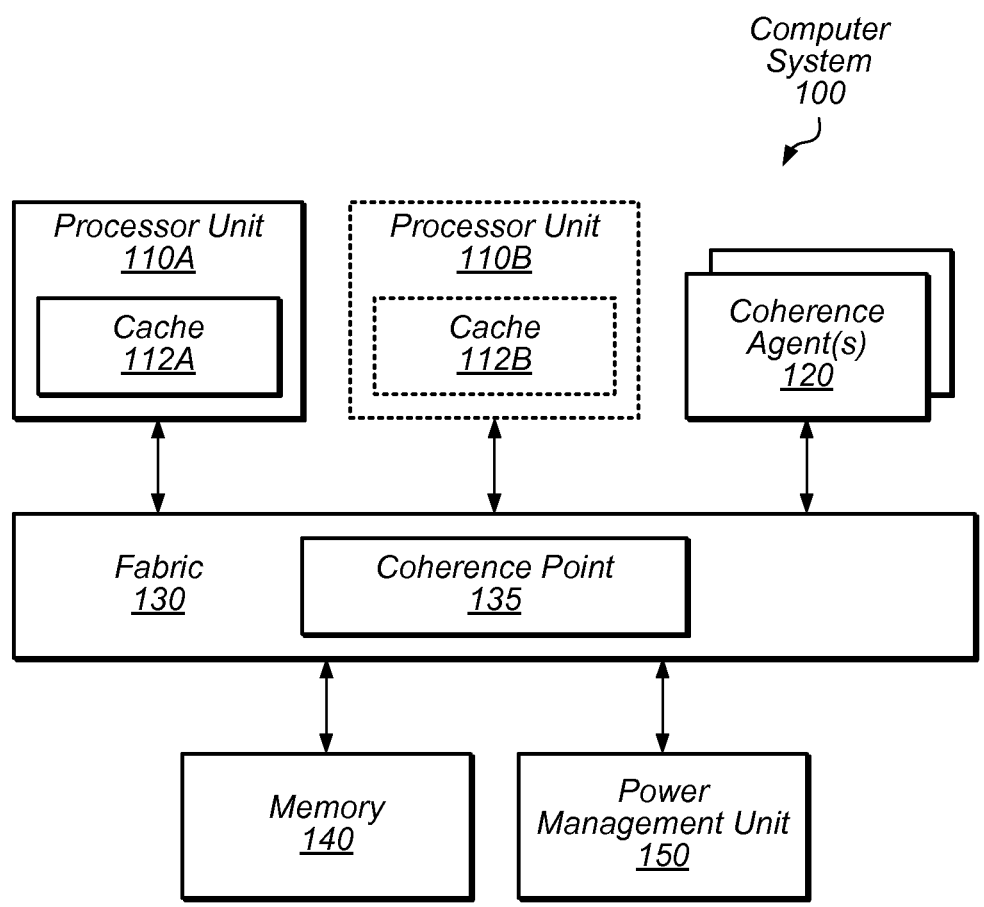
FIG. 1 is a block diagram of one embodiment of a computer system that implements cache coherency.

Turning now to FIG. 1, a block diagram of a computer system 100 that implements a cache coherency scheme is depicted. As used herein, the term "cache coherency" refers to the process of ensuring that data within a cache is consistent with other instances of the data stored elsewhere within a computer system, such as in memory and/or other caches. The phrase "cache coherency scheme" refers to the manner in which cache coherency is achieved in a particular implementation. In the illustrated embodiment, computer system 100 includes processor unit 110A, one or more coherence agents 120, a memory 140, and a power management unit 150 that are coupled together via a fabric 130. In some embodiments, system 100 may include one or more additional processors 110 as indicated with processor unit 110B. Processors 110A and 110B, in turn, include caches 112A and 112B, respectively. Fabric 130, in turn, includes a coherence point 135.

Processor units 110, in one embodiment, are general-purpose processors such as central processing units (CPUs). Processor units 110 may, however, be any suitable type of processor. For example, in other embodiments, processor units 110 may be a graphics processor unit (GPU), application specific integrated circuit (ASIC), a field programmable gate array (FPGA), etc. Processor units 110 may implement any instruction set architecture, and may be configured to execute instructions defined in that instruction set architecture. Processor units 110 may employ any microarchitecture, including scalar, superscalar, pipelined, superpipelined, out of order, in order, speculative, non-speculative, multi-threaded, etc., or combinations thereof. Processor units 110 may include circuitry to implement microcoding techniques. In some embodiments, processor units 110 may include multiple processing cores capable of separately executing instructions in parallel. As will be described below, in some embodiments, processor units 110 may include one or more cache levels to facilitate accessing data from memory 140.

Coherence agents 120, in one embodiment, are circuits that are configured to access and/or modify data within memory 140 in a manner that may affect cache coherency. Coherence agents 120 may include various types of I/O devices (e.g., display devices, audio devices, user input devices, image processing devices, etc.), network interface devices (e.g., wired interfaces devices such as an Ethernet device, wireless interface devices such as Wifi devices, cellular devices, etc.), interface controller devices (e.g., a universal serial bus (USB) controller, a peripheral component interconnect express (PCIe) controller, etc.), etc. In some embodiments, coherence agents 120 may also include one or more caches to facilitate accessing data from memory 140; in other embodiments, coherence agents may not maintain caches.

Fabric 130, in one embodiment, is configured to facilitate communication between devices 110-150. Fabric 130 may include any suitable interconnecting circuitry such as meshes, network on a chip fabrics, shared buses, point-to-point interconnects, etc. In one embodiment, fabric 130 may include Northbridge and Southbridge controllers. In some embodiments, fabric 130 may include one or more controller circuits configured to support direct memory access (DMA). In the illustrated embodiment, fabric 130 is configured to facilitate accessing memory 140 by processor units 110 and coherence agents 120. As will be described below, in some embodiments, fabric 130 is configured to facilitate (via coherence point 135) maintaining cache coherency between caches 112 and memory 140.

Memory 140, in one embodiment, is configured to implement a primary storage for computer system 100. Accordingly, memory 140 may include, for example, dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more of these memory devices may be coupled onto a circuit board to form memory modules such as single inline memory modules (SIMMs), dual inline memory modules (DIMMs), etc. In some embodiments, memory 140 may include various types of secondary storage such as hard disks, solid-state devices, optical devices, tape devices, etc. In some embodiments, memory 140 may include various types of tertiary storage such as network attached storages (NASs), storage array networks (SANs), etc.

Caches 112, in one embodiment, are configured to store data from memory 140 such that the data is proximal to processor units 110 for access. Caches 112 may correspond to any suitable cache level—e.g., in one embodiment, cache 112 is a level-2 (L2) cache shared by multiple processing cores, which each maintain a respective level-1 (L1) cache. Caches 112 may support any suitable caching scheme such as write-back or write-through schemes. Caches 112 may be any size and support any configuration (e.g., direct mapped, set associative, or fully associative). As will be described below with respect to FIG. 2, in various embodiments, caches 112 are configured to store tag data within a set of tag structures that is usable to access data stored within a set of cache line structures. As used herein, the terms "tag data" (or simply tags) refer to metadata that is usable to retrieve data from a cache. Tag data may include memory addresses, process identifiers (PIDs), thread identifiers, and/or virtual machine identifiers. The term "tag structure" refers to circuitry configured to store a tag. In one embodiment, caches 112 are configured to be power managed by power management unit 150 discussed below.

Coherence point 135, in one embodiment, is configured to maintain coherency between caches 112 and memory 140. Accordingly, in various embodiments, coherence point 135 monitors read and write requests passing through fabric 130 from processor units 110 and coherence agents 120 to memory 140 to determine whether valid data in caches 112 needs to be invalidated. As used herein, the term "valid data" refers to an instance of data within a cache that has been marked to indicate (e.g., with a valid bit) that it is usable by a processor—due to it being either consistent with data stored in memory or dirty data. As used herein, "dirty data" refers to an instance of data within a cache that has been marked to indicate that the data has been modified and is awaiting a write back to memory. In contrast, "invalid data" refers to an instance of data that has been marked to indicate that it is no longer consistent with memory but has not been modified since being loaded into the cache. The term "invalidating" refers to the marking of an instance of data as invalid. In one embodiment, in response to determining that data needs to be invalidated, coherence point 135 may further instruct a cache 112 to invalidate the cache entry including the data. As will be discussed with respect to FIG. 4, in some embodiments, coherence point 135 is configured to maintain the tag data of caches 112 within a duplicate set of tag structures located within coherence point 135. In such an embodiment, coherence point 135 may use this tag data to determine whether entries within caches 112 need to be invalidated. By maintaining tag data locally, in various embodiments, coherence point 135 is able to more quickly determine whether cache entries should be invalidated (as opposed to polling each cache 112 for tag data on a case-by-case basis). In some embodiments, coherence point 135 is also configured to use the duplicate tag structures to facilitate the retrieval of data. For example, in one embodiment, coherence point 135 may receive a read request from a coherence agent 120 and determine, from the duplicate tag structures, that a cache 112 includes an instance of the request data. In some embodiments, if memory 140 includes a stale instance of the data (i.e., a processor unit 110 has modified data but not yet written it back to memory 140) or if a write request from a processor unit 110 is in flight to memory 140, coherence point 135 may service the request by retrieving the data from the cache 112 (as opposed to memory 140) and providing the data to the requesting coherence agent 120. As will be discussed next, power management unit 150 may be configured to power manage coherence point 135.

Power management unit 150, in one embodiment, is configure to power manage circuits within computers system 100. In some embodiments, power management may include clock gating and/or power gating various ones of the circuits. As used herein, the term "clock gating" refers to the process of disabling a clock signal that is provided to a circuit to drive logic (e.g., by closing a gate). As used herein, the term "power gating" refers to the process of disabling a voltage signal (e.g., also by closing a gate) that provides power to a circuit. The terms "powering down," "reducing power," and the like refer generally to reducing a circuit's power consumption such as through the usage of power gating or clock gating. In many instances, powering down a circuit may result in disabling some or all functionality of a circuit. Conversely, "powering up" refers to restoring power to circuit. Accordingly, in some embodiments discussed below, power management unit 150 is configured to power down caches 112 and one or more portions of coherence point 135. For example, in one embodiment, power management unit 150 is configured to power down one or more portions of coherence point 135 (e.g., the duplicate tag structures within coherence point 130) in response to powering down caches 112. In many instances, powering down circuits such as caches 112 and coherence point 135 can reduce the overall power consumption of computer system 100.

Figure 2:
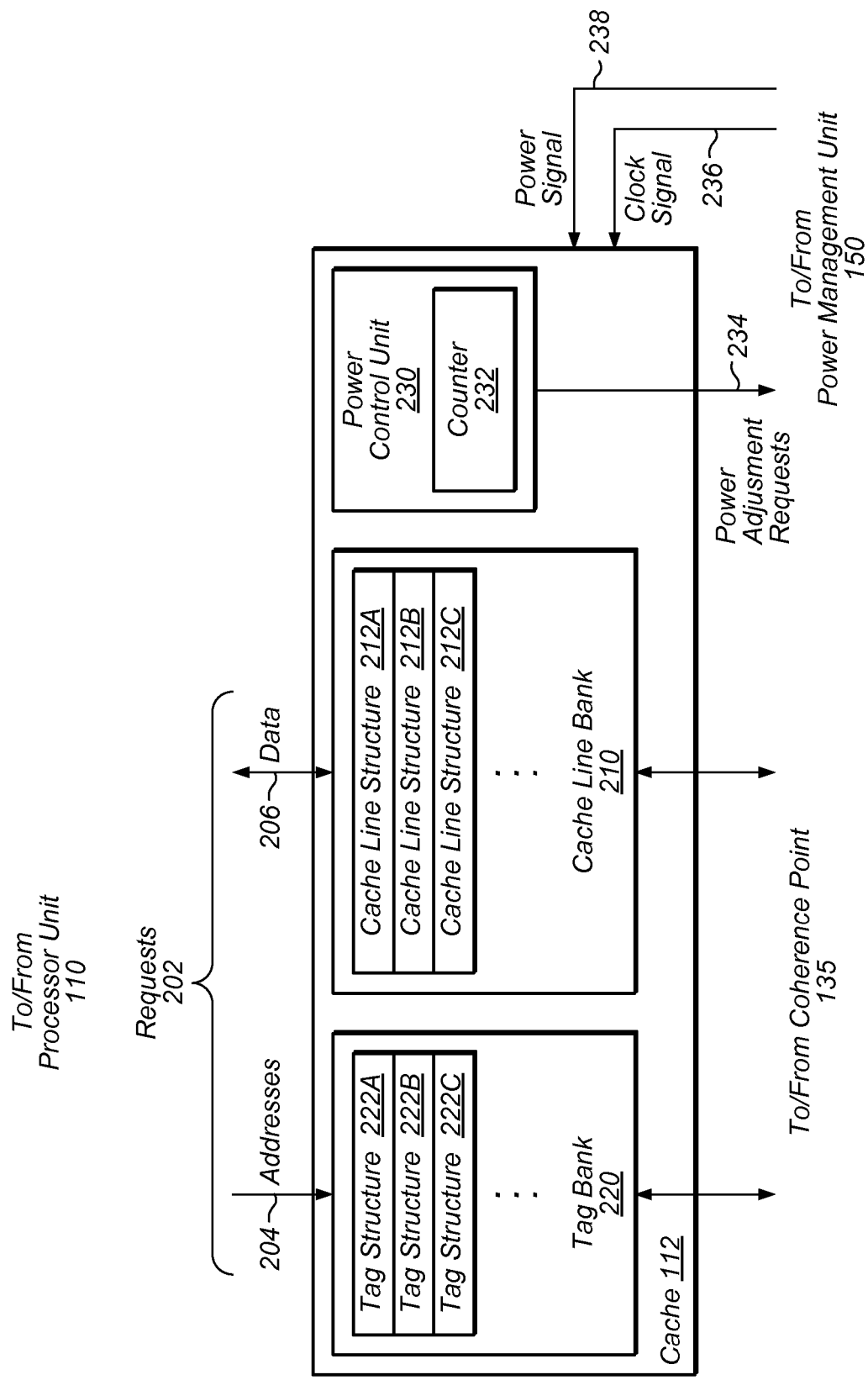
FIG. 2 is a block diagram of one embodiment of a cache within the computer system.

Turning now to FIG. 2, a block diagram of a cache 112 is depicted. As discussed above, in various embodiments, cache 112 is configured to store data accessible by processor unit 110 and be power managed by power management unit 150. In the illustrated embodiment, cache 112 includes a cache line bank 210, which includes multiple cache line structures 212A-C; a tag bank 220, which includes multiple tag structures 222A-C; and a power control unit 230, which includes a counter 232.

Cache bank 210, in one embodiment, maintains cache lines of data 206 within addressable structures 212. In some embodiments, a given cache line may include multiple individually addressable cache entries of data 206. In such an embodiment, cache bank 210 may be configured such that an entire cache line is read at given time even though a request may only be for a given cache entry.

Tag bank 220, in one embodiment, maintains tags within tag structures 222 that are usable to determine whether a given request 202 hits in (i.e., has data 206 within) cache 112. In various embodiments, tag bank 220 may be configured to index into cache bank 210 in response to an address 204 matching a tag within one of tag structures 222. That is, if a given request 202 is a read request that hits in cache 112, tag bank 220 may raise the appropriate control line selecting the corresponding cache line structure 212 and cause the data 206 within that structure 212 to be returned to the processor unit 110. On the other hand, if a given request 202 is a write request that hits in cache 112, tag bank 220 may raise the appropriate control line selecting the corresponding cache line structure 212 to cause the data 206 to be written to an entry within that structure 212. In one embodiment, tag bank 220 may also be configured to signal a cache miss in response to a given request 202 missing in (i.e., not having a data 206 within) cache 112. In such an instance, the given request 202 may be forwarded on to coherence point 135 as shown in the illustrated embodiment. In some embodiments, tag bank 220 may also include structures usable to store flag data such as valid bits, dirty bits for implementing a write-back cache, etc. As will be discussed with respect to FIG. 4, in various embodiments, coherence point 135 includes a duplicate set of tag structures to store a copy of tag data from structures 222.

Power control unit 230, in one embodiment, is configured to control whether cache 112 is powered up or down by power management unit 150. As shown, cache 112 may receive one or more clock signals 236 and/or power signals 238 from power management unit 150. In some embodiments, power control unit 230 controls whether cache 112 is to be powered up or powered down by providing a power adjustment request 234 to unit 150. In the illustrated embodiment, power control unit 230 determines when cache 112 needs to be powered down based on counter 232. In various embodiments, counter 232 tracks the amount of valid data in cache 112 such as the number of valid cache lines, the number of valid cache entries, etc. (in such an embodiment, counter 232 may be adjusted as valid flags are set and cleared). In such an embodiment, in response to counter 232 indicating that cache 112 does not include valid data, power control unit 234 may provide a power adjustment request 234 to power management unit 150 to cause unit 150 to clock gate and/or power gate cache 112. In some embodiments, when cache 112 has been powered down, power control unit 234 may continue to operate in order to determine whether cache 112 needs to be powered back up. (In such an embodiment, power control unit may continue to receive power independently of the other structures in cache 112). In one embodiment, power control unit 230 determines that cache 112 needs to be powered up in response to cache 112 receiving a request 202, which will result in a cache miss since cache 112 does not include valid data. Accordingly, power control unit 230 may provide a corresponding power adjustment request 234 to cause power management unit 150 to discontinue clock gating and/or power gating cache 112.

As will be discussed below, in various embodiments, power management unit 150 may coordinate the powering down of cache 112 with the powering down of coherence point 135 including the duplicate tag structures within point 135. For example, in one embodiment, if cache 112 submits a request 234 to be powered down, power management unit 150 may determine to also power down portions of coherence point 135 including the duplicate tag structures. (As noted below, in some embodiments in which coherence point 135 is shared among multiple caches 112, power management unit 150 may wait until it is has received a respective request 234 from each cache 112 before determining to power down the portions of coherence point 135).

In various embodiments, power management unit 150 also coordinates the powering up of cache 112 with the powering up of coherence point 135. Accordingly, in one embodiment, when cache 112 issues a request 234 to be powered up in response to a request 202 missing in cache 112, power management unit 150 may also power on the powered-down portions of coherence point 135 (including the duplicate set of tag structures) prior to completion of the request 234 being serviced and coherence point 135 receiving the data. In some embodiments, powering on both the coherence point 135 and cache 112 upon detecting a cache miss significantly reduces the latency time for servicing an initial request 202 as powering on cache 112 and coherence point 135 may take a considerable number of cycles as state is reloaded into those units. By initiating the powering on of these units well beforehand, they can be operational when a request needs to be serviced at each unit; for example, a request from processor unit 110 may schedule a wake up of cache 112 and duplicate tag bank 420 such that when the request arrives at coherence point 135, duplicate tag bank 420 is ready to process the request without stalling. Thus, power management unit 150 may enable the latency for an initial request 202 after power up to be indistinguishable from (i.e., the same as) the latency of a subsequent request 202

Figure 3:
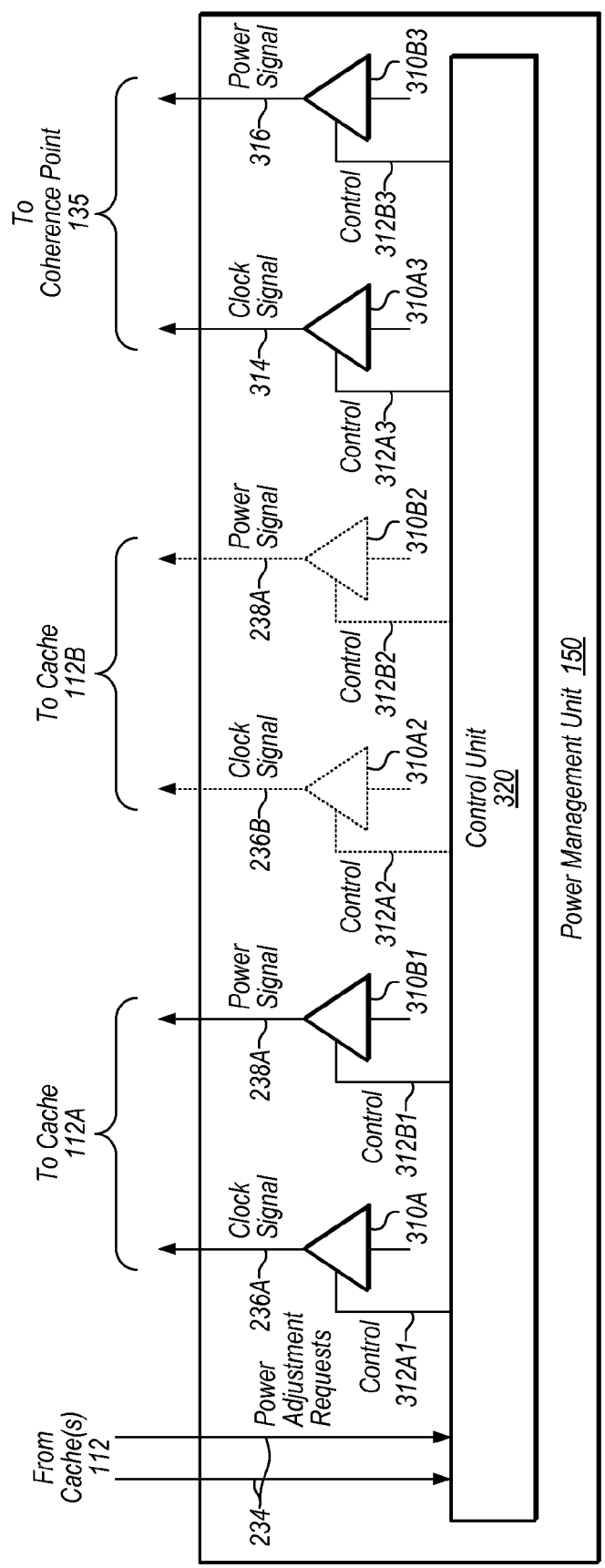
FIG. 3 is a block diagram of one embodiment of a power management unit within the computer system.

Turning now to FIG. 3, a block diagram of power management unit 150 is depicted. As discussed above, in various embodiments, power management unit 150 is configured to power manage circuitry of computer system 100 including caches 112 and coherence point 135. In the illustrated embodiment, power management unit 150 includes multiple gates 310A1-B3 and a control unit 320. It is noted that, although gates 310 are shown as being within power management unit 150, in some embodiments, gates 310 may be located within (or proximal to) the units that they control—e.g., caches 112 and coherence point 135.

In the illustrated embodiment, gates 310A are configured to control clock signals 236A, 236B, 314 to caches 112A, cache 112B, coherence point 135, respectively; gates 310B are configured to control power signals 238A, 238B, and signal 316 to caches 112A, cache 112B, and coherence point 135, respectively. As shown, gates 310A1-B3 may be operated (i.e., closed and opened) by respective control signals 312A1-B3 from control unit 320.

Control unit 320, in one embodiment, is configured to manage operation of power management unit 150. In various embodiments, control unit 320 may determine whether operate gates according to any of various criteria. As discussed above, in one embodiment, control unit 320 is configured to power down a cache 112 in response to receiving a power adjustment request 234. In some embodiments, control logic 320 may determine whether to clock gate or power gate a cache 112 based on an expectation of how long a cache 112 is to remain in a power managed state (e.g., as specified by an operating system executing on processor unit 110). That is, in some instances, clock gating may allow a circuit to more quickly enter and exit a power managed state as clock gating may permit the circuit to maintain state. On the other hand, in other instances, power gating may allow a circuit to achieve greater power consumption, but may take longer to initialize the circuit as its state may need to be reloaded from memory. Accordingly, in one embodiment, control unit 320 may clock gate a cache 112 in response to it not including any valid data, for example, due to processor unit 110 being temporarily inactive; however, in one embodiment, control unit 320 may power gate a cache 112 in response to computer system 100 entering a power managed state in which memory 140 is suspend for some time.

As discussed above, in various embodiments, control unit 320 may power down portions of coherence point 135, such as the duplicate tag structures, in response to requests 234. Accordingly, in one embodiment in which computer system 100 has multiple caches 112, control unit 320 is configured to power down portions coherence point 135 only after each cache 112 has issued a request 234 to be powered down. In another embodiment, however, coherence point 135 may include different portions that correspond to a respective one of the caches 112—e.g., a respective set of duplicate tag structures for each cache 112. In such embodiment, control unit 320 may be configured to power down the relevant portions of coherence point 135 in response to a given cache 112 submitting a request 234 while continuing to maintain power to portions relevant to other caches 112. In some embodiments, control unit 320 is configured to power down portions of coherence point 135 in the same manner that it powers down caches 112. That is, control unit 320 may be configured to not power gate portions of coherence point 135 unless it has also power gated caches 112.

Figure 4:
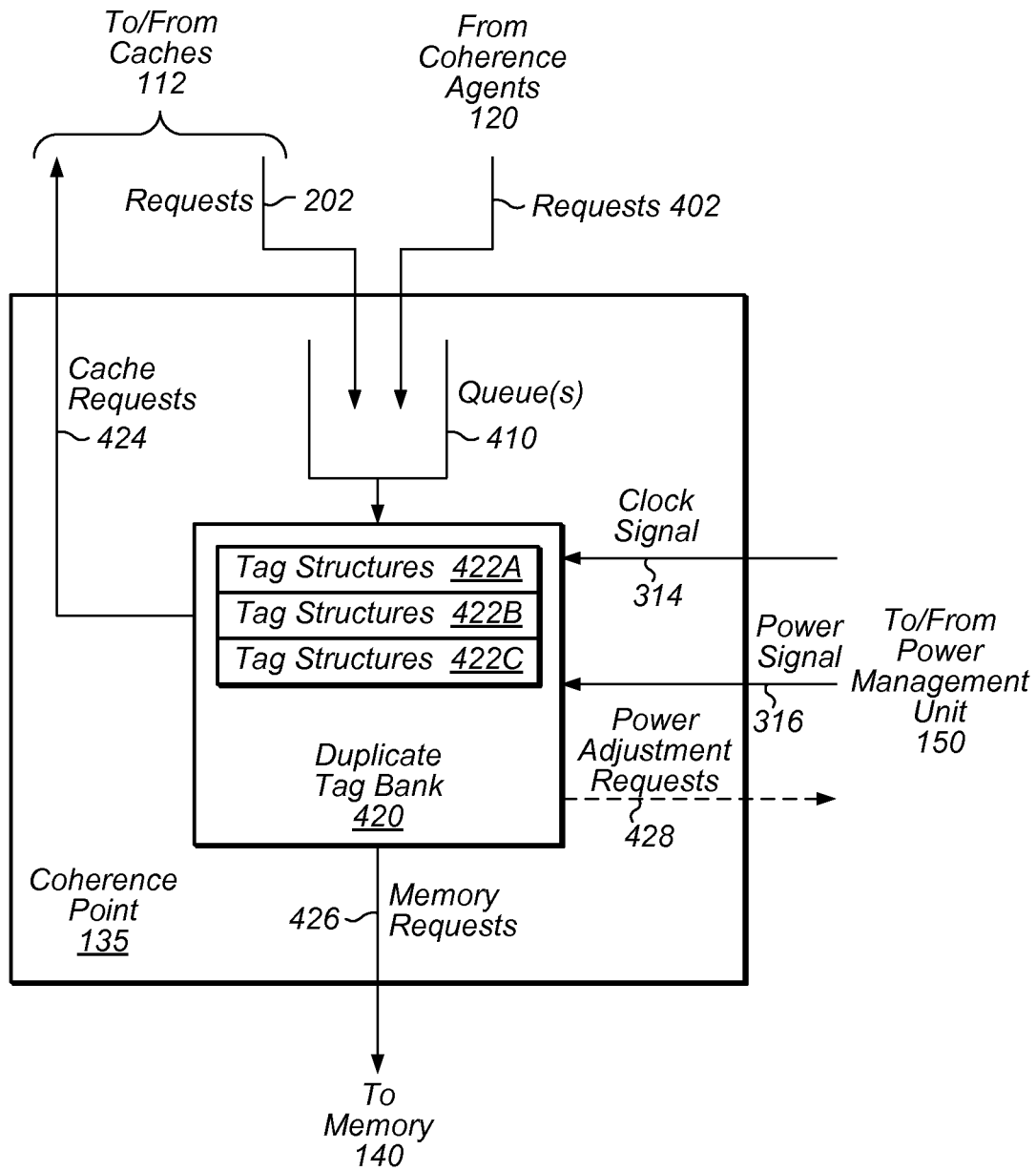
FIG. 4 is a block diagram of one embodiment of a coherence point within the computer system.

Turning now to FIG. 4, a block diagram of coherence point 135 is depicted. As discussed above, in various embodiments, coherence point 135 is configured to maintain cache coherency between caches 112 and memory 140. In some embodiments, coherence point 135 may also facilitate servicing data requests by retrieving data from caches 112 or memory 140. In the illustrated embodiment, coherence point 135 includes one or more queues 410 and a duplicate tag bank 420, which includes a set of tag structures 422.

Queues 410, in one embodiment, are configured to receiving data request 202 from caches 112 and data requests 402 from coherence agents 120 until they can be processed by coherence point 135. Upon pulling a request from a queue 410, coherence point 135 may examine the address of the request relative to duplicate tag bank 420.

Duplicate tag bank 420, in one embodiment, is configured to store tag data from caches 112 locally in a duplicate set of tag structures 422 as discussed above. In one embodiment, upon receiving a request from a queue 410, bank 420 may indicate whether the address of that request has a corresponding tag in a structure 422 (and thus indicate whether a cache 112 has a cache entry associated with the request). In the illustrated embodiment, if a given request specifies an address that has a corresponding tag in bank 420, coherence point 135 may issue a corresponding request 424 to the relevant cache 112. In the case that the request is a write request, in one embodiment, the request 424 may be a request to invalidate the cache entry corresponding to the specified address (or, in some embodiments, request 414 may be a request to update the cache entry with the data being written). In the case that the request is a read request, in one embodiment, request 424 may be a request to retrieve the relevant data associated with the specified address. On the other hand, in the illustrated embodiment, if the request specifies an address that does not have a corresponding tag in bank 420, coherence point 135 may pass the request on to memory 140 as a request 426.

As discussed above, in various embodiments, power management unit 150 is configured to power manage portions of coherence point 135 including duplicate tag structures 422. Accordingly, in the illustrated embodiment, unit 150 manages power via clock signal 314 and power signal 316. Although not depicted, in some embodiments, signals 314 and 316 may also be provided to other portions of coherence point 135 such as queues 410, control logic within coherence point 135, etc. to facilitate controlling power to those circuits. As described above, in many instances, adjusting the power of circuits such as those depicted in coherence point 135 and cache 112 may enable a computer system such as computer system 100 to implement cache coherency in a power efficient manner.

Although various embodiments have been described above in which duplicate tag bank 420 is powered up and down responsive to requests 234 from caches 112, in some embodiments, coherence point 135 may be configured to determine whether to power up or down portions independently of caches 112. For example, in one embodiment, coherence point 135 may also maintain a duplicate set of flag data (e.g., valid bits, dirty bits, etc.) from caches 112 (or, in some embodiments, maintain counters for each cache 112 similar to counters 232 discussed above). Coherence point 135 may then send a power adjustment request 428 for one or more portions such as tag bank 420 to be powered down—e.g., if the duplicate flag data indicates that none of tag structures 422 is a storing a tag associated with valid data. In one embodiment, if portions are powered down, coherence point 135 may also send a request 428 to power them back up in response to receiving a request 202 destined to memory 140.

Methods associated with reducing power are described next with respect to FIGS. 5A and 5B.

Figure 5A:
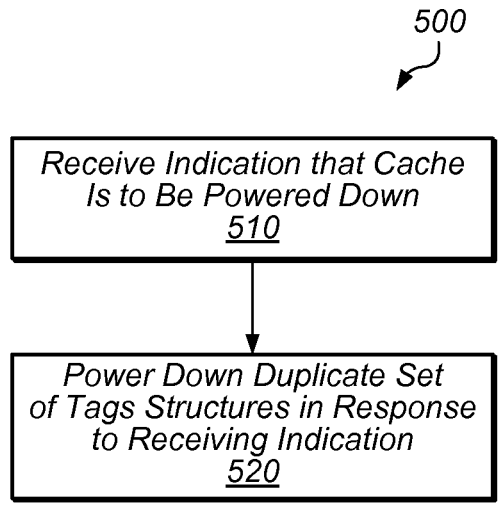
FIGS. 5A and 5B are flow diagrams illustrating embodiments of methods for reducing power consumption.

Turning now to FIG. 5A, a flow diagram of a method 500 for reducing power consumption is depicted. Method 500 is one embodiment of method that may be performed by a computer system having a power management unit such as power management unit 150. In some embodiments, performance of method 500 may reduce the power consumed to implement cache coherency.

In step 510, a power management unit of the computer system receives an indication (e.g., request 234) that a cache (e.g., cache 112) having a set of tag structures (e.g., structures 222) is to be powered down. As discussed above, in one embodiment, the indication indicates that the cache does not include valid data (e.g., within cache line structures 212).

In step 520, the power management unit powers down a duplicate set of tags structures (e.g., structures 422) in response to receiving the indication. In one embodiment, the duplicate set of tag structures is used to determine whether data in the cache is to be invalidated to maintain cache coherency. In some embodiments, the power management unit powers down the duplicate set of tag structures by clock gating the duplicate set of tag structures (e.g., via a gate 310A). In some embodiments, the power management unit powers down the duplicate set of tag structures by power gating the duplicate set of tag structures (e.g., via a gate 310B). In one embodiment, the power management unit does not power gate the duplicate set of tag structures unless the cache has been power gated.

In some embodiments, method 500 may further include the power management unit powering up the duplicate set of tag structures in response to a request for data (e.g., request 202) missing in the cache.

Figure 5B:
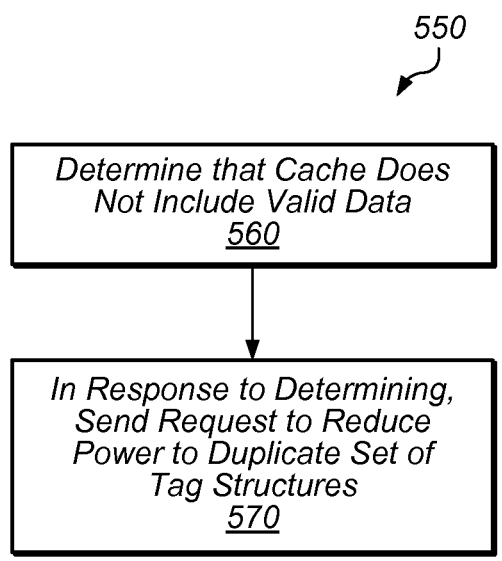

Turning now to FIG. 5B, another flow diagram of a method 550 for reducing power consumption is depicted. Method 550 is one embodiment of method that may be performed by a processor including a cache such as a processor unit 110. In some embodiments, performance of method 550 may reduce the power consumed to implement cache coherency.

As shown, method 550 begins in step 560 with a processor determining that a cache (e.g, cache 112) having a set of tag structures (e.g., structures 222) storing tag data does not include valid data. Method 550 continues in step 570 with the processor sending, in response to the determining of step 560, a request (e.g., power adjustment request 234) to reduce power to a duplicate set of tag structures storing the tag data. In some embodiments, method 550 may further include the processor notifying the power management unit (e.g., via a power adjustment request 234) that a data request has missed in the cache. In such an embodiment, the power management unit may provide power (e.g., via one or more of signals 236 and 238) to the set of tag structures in response to the notifying.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a cache having a set of tag structures, wherein the cache is configured to:
track an amount of valid data stored in the cache; and
in response to determining that the cache does not include valid data, send, to a power management unit, a request to power down the cache; and
the power management unit configured to power down the cache and a duplicate set of tag structures in responsive to the request.

2. The apparatus of claim 1, wherein the cache is configured to:
maintain a counter indicative of the amount of valid data stored within the cache; and
send the request based on a value of the counter.

3. The apparatus of claim 1, wherein the duplicate set of tag structures is located within a coherence point configured to maintain coherency between the cache and a memory.

4. The apparatus of claim 3, further comprising:
a processor unit that includes the cache, wherein the processor unit is configured to access the memory via a fabric that includes the coherence point.

5. An apparatus, comprising:
a power management unit configured to:
receive an indication from a cache having a set of tag structures in response to the cache determining that the cache does not include valid data;
in response to the indication, power down the cache and a duplicate set of tag structures corresponding to the set of tag structures in the cache; and
power up the duplicate set of tag structures in response to a request for data missing in the cache.

6. The apparatus of claim 5, wherein the apparatus is configured to use the duplicate set of tag structures to determine whether data in the cache is to be invalidated to maintain cache coherency.

7. The apparatus of claim 5, wherein the power management unit is configured to power down the duplicate set of tag structures by clock gating the duplicate set of tag structures.

8. An apparatus, comprising:
a cache including a first set of tag structures, wherein the cache is configured to:
store tag data in the first set of tag structures;
determine whether the cache contains valid data; and
in response to determining that the cache does not contain valid data, issue a request to be powered down;
a second set of tag structures configured to store a duplicate copy of the tag data; and
wherein the apparatus is configured to power down the cache and the second set of tag structures in response to the request.

9. The apparatus of claim 8, further comprising:
a circuit configured to receive a request for data stored in a memory, wherein the circuit is configured to access the second set of tag structures to determine whether the cache stores an instance of the data.

10. The apparatus of claim 8, further comprising:
a processor that includes a plurality of processing cores, wherein each processing core includes a respective level-1 cache, and wherein the cache including the first set of tag structures is a level-2 cache of the processor.

11. The apparatus of claim 8, wherein the apparatus is configured power down the second set of tag structures by power gating the second set of tag structures.

12. An apparatus, comprising:
a coherence point configured to maintain cache coherency between one or more caches and a memory, including maintain a duplicate set of tag structures for a set of tag structures in the one or more caches; and
a power management unit is configured to:

receiving an indication that the one or more caches do not include valid data;

in response to the indication:
reduce power to the one or more caches; and
reduce power to at least a portion of the coherence point, wherein the portion includes the duplicate set of tag structures; and power up the portion of the coherence point in response to a request for data missing in one of the one or more caches.

13. The apparatus of claim 12, wherein the coherence point is configured to use the duplicate set of tag structures to determine whether to invalidate data in the one or more caches.

14. The apparatus of claim 12, wherein the coherence point is configured to:
receive a request for data stored in memory;
determine, based on the duplicate set of tag structures, that one of the one or more caches stores an instance of the data; and
retrieve the data from the cache storing the instance to service the request for data.

15. The apparatus of claim 12, wherein the power management unit is configured to not power gate the portion of the coherence point unless the one or more caches have been power gated.

16. A method, comprising:
a cache of a processor determining that the cache does not include valid data, wherein the cache includes a set of tag structures storing tag data;

in response to the determining, the cache sending, to a power management unit, a request to reduce power to the cache and a duplicate set of tag structures storing the tag data; and in response to the request, the power management unit reducing power to the cache and the duplicate set of tag structures.

17. The method of claim 16, further comprising:
the processor notifying the power management unit that a data request has missed in the cache, wherein the power management unit is configured to provide power to the set of tag structures in response to the notifying.

18. The method of claim 16, further comprising:
the processor issuing a read request to a memory via a coherence point, wherein the coherence point uses the duplicate set of tag structures to service the request by retrieving data from another cache within another processor; and
the processor receiving, from the coherence point, a response including the data.

19. The method of claim 18, further comprising:
the processor issuing a write request to the memory via the coherence point, wherein the coherence point invalidates data in the other cache in response to the write request.

20. The method of claim 16, further comprising:
the processor providing tag data from the set of tag structures to a coherence point maintaining the duplicate set of tag structures; and
the processor receiving, from the coherency point, a request to invalidate a cache line within the cache.

* * * * *